(12) United States Patent
Terashima et al.

(10) Patent No.: US 9,159,563 B2
(45) Date of Patent: Oct. 13, 2015

(54) SEMICONDUCTOR DEVICE MANUFACTURING METHOD AND SEMICONDUCTOR MANUFACTURING APPARATUS

(71) Applicants: Tomohide Terashima, Tokyo (JP); Yasuhiro Yoshiura, Tokyo (JP); Eiko Otsuki, Tokyo (JP)

(72) Inventors: Tomohide Terashima, Tokyo (JP); Yasuhiro Yoshiura, Tokyo (JP); Eiko Otsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/427,852

(22) PCT Filed: Sep. 26, 2012

(86) PCT No.: PCT/JP2012/074626
§ 371 (c)(1),
(2) Date: Mar. 12, 2015

(87) PCT Pub. No.: WO2014/049696
PCT Pub. Date: Apr. 3, 2014

(65) Prior Publication Data
US 2015/0228488 A1    Aug. 13, 2015

(51) Int. Cl.
*H01L 21/02* (2006.01)
*H01L 21/263* (2006.01)
(Continued)

(52) U.S. Cl.
CPC ........... *H01L 21/263* (2013.01); *H01J 37/3002* (2013.01); *H01L 21/67115* (2013.01); *H01L 21/67745* (2013.01); *H01L 21/68* (2013.01);
(Continued)

(58) Field of Classification Search
CPC ..................................................... H01L 21/02
See application file for complete search history.

(56) References Cited

U.S. PATENT DOCUMENTS 4,204,466 A * 5/1980 Schnee ....................... 99/443 C
5,935,629 A   8/1999 Martin
(Continued)

FOREIGN PATENT DOCUMENTS

JP   H05-128992 A   5/1993
JP   2009-236633 A   10/2009
(Continued)

OTHER PUBLICATIONS

International Search Report; PCT/JP2012/074626; Oct. 30, 2012.
(Continued)

*Primary Examiner* — Saehvosh Nikmanesh
(74) *Attorney, Agent, or Firm* — Studebaker & Brackett PC (57) ABSTRACT

A semiconductor device manufacturing method according to the present invention includes a step of arranging a plurality of processing objects on a first tray and a second tray adjacent to the first tray, a plurality of application steps in which application of an application substance to the plurality of processing objects is repeated a certain number of times by emitting the application substance from an application device formed right above a contact position at which the first tray and the second tray contact each other, by swinging the application device along a first direction across the contact position, and by moving the first tray and the second tray in a second direction perpendicular to the first direction, and an interchange step of interchanging the first tray and the second tray in position without changing the directions of the first tray and the second tray corresponding to the second direction, the interchange step being executed at least one time among the plurality of application steps.

5 Claims, 8 Drawing Sheets

(51) Int. Cl.
    *H01L 21/67*     (2006.01)
    *H01L 21/68*     (2006.01)
    *H01L 21/677*     (2006.01)
    *H01J 37/30*     (2006.01)

(52) U.S. Cl.
    CPC ...... *H01J 2237/202* (2013.01); *H01J 2237/317* (2013.01)

(56) References Cited

U.S. PATENT DOCUMENTS

| | | | |
|---|---|---|---|
| 6,056,108 A * | 5/2000 | Buchi et al. | 198/395 |
| 2004/0104202 A1 | 6/2004 | Downes et al. | |

FOREIGN PATENT DOCUMENTS

| | | |
|---|---|---|
| JP | 2012-044018 A | 3/2012 |
| TW | 200907334 A | 2/2009 |

OTHER PUBLICATIONS

An Office Action issued by the Taiwan Intellectual Property Office on Sep. 25, 2014, which corresponds to Taiwanese Patent Application No. 101144105; with partial English language translation.

Notification of Transmittal of Translation of the International Preliminary Report on Patentability and Translation of Written Opinion of the International Searching Authority; PCT/JP2012/074626; issued on Apr. 9, 2015.

\* cited by examiner

SEMICONDUCTOR DEVICE MANUFACTURING METHOD AND SEMICONDUCTOR MANUFACTURING APPARATUS

TECHNICAL FIELD

This invention relates to a semiconductor device manufacturing method including a step of applying electrons or ions to a processing object and to a semiconductor manufacturing apparatus used for the manufacturing method.

BACKGROUND ART

Patent Literature 1 discloses a technique for continuously or intermittently applying an electron beam to a processing object along the width direction of the processing object. The electron beam is applied by positioning the focus of the electron beam so that the focus is remoter than the surface of the processing object when the electron beam is perpendicularly incident on the front of the processing object. The intensity of the electron beam at the center in the width direction of the processing object is thereby reduced, while the intensity of the electron beam at the opposite ends in the width direction of the processing object is thereby increased. As a result, the electron beam is applied uniformly along the width direction of the processing object.

PRIOR ART

Patent Literature

Patent Literature 1: Japanese Patent Laid-Open No. H5-128992

SUMMARY OF INVENTION

Technical Problem

In some cases, an application substance is applied to a plurality of processing objects by repeatedly swinging an application device for emitting the application substance and by feeding the plurality of processing objects in a direction perpendicular to the swing direction below the application device. The processing objects are disposed by being arranged in a plurality of rows along the feed direction in order to increase the processing efficiency.

Some of the processing objects in the vicinity of the position right below the application device and others of the processing objects remote from the position right below the application device are at different distances from the application device and therefore receive the incident application substance with different acceleration energies. The angle of incidence of the application substance also varies between these processing objects. Thus, the effect of application varies depending on the positions of the processing objects relative to the application device, resulting in variations in characteristics of the processing objects.

The present invention has been achieved to solve the above-described problem, and an object of the present invention is to provide a semiconductor device manufacturing method and a semiconductor manufacturing apparatus which enable reduction of variations in the application effect on a plurality of processing objects.

Means for Solving the Problems

A semiconductor device manufacturing method according to the present invention includes a step of arranging a plurality of processing objects on a first tray and a second tray adjacent to the first tray, a plurality of application steps in which application of an application substance to the plurality of processing objects is repeated a certain number of times by emitting the application substance from an application device formed right above a contact position at which the first tray and the second tray contact each other, by swinging the application device along a first direction across the contact position, and by moving the first tray and the second tray in a second direction perpendicular to the first direction, and an interchange step of interchanging the first tray and the second tray in position without changing the directions of the first tray and the second tray corresponding to the second direction, the interchange step being executed at least one time among the plurality of application steps.

A semiconductor device manufacturing method according to another aspect of the present invention includes a step of placing a plurality of processing objects on a tray, a plurality of application steps in which application of an application substance to the plurality of processing objects is repeated a certain number of times by emitting the application substance from an application device formed right above the tray, by swinging the application device along a first direction, and by moving the tray in a second direction perpendicular to the first direction, and a processing object reversal step of reversing each of the plurality of processing objects among the plurality of application steps so that the processing object faces in a direction opposite to the second direction.

A semiconductor manufacturing apparatus according to the present invention includes a first tray, a second tray adjacent to the first tray, an application device formed right above a contact position at which the first tray and the second tray contact each other, the application device being swung along a first direction across the contact position while emitting an application substance, and a conveyor that feeds the first tray and the second tray in a second direction perpendicular to the first direction.

Other features of the present invention will be made clear below.

Advantageous Effects of Invention

According to the present invention, variation in the application effect on a plurality of application targets can be reduced by providing a step of changing the positions or directions of the application targets between a plurality of application steps.

DESCRIPTION OF EMBODIMENTS

A semiconductor device manufacturing method and a semiconductor manufacturing apparatus according to an embodiment of the present invention will be described with reference to the drawings. Identical or corresponding components are indicated by the same reference characters and repeated descriptions of them are avoided in some cases.

Embodiment 1

Figure 1:
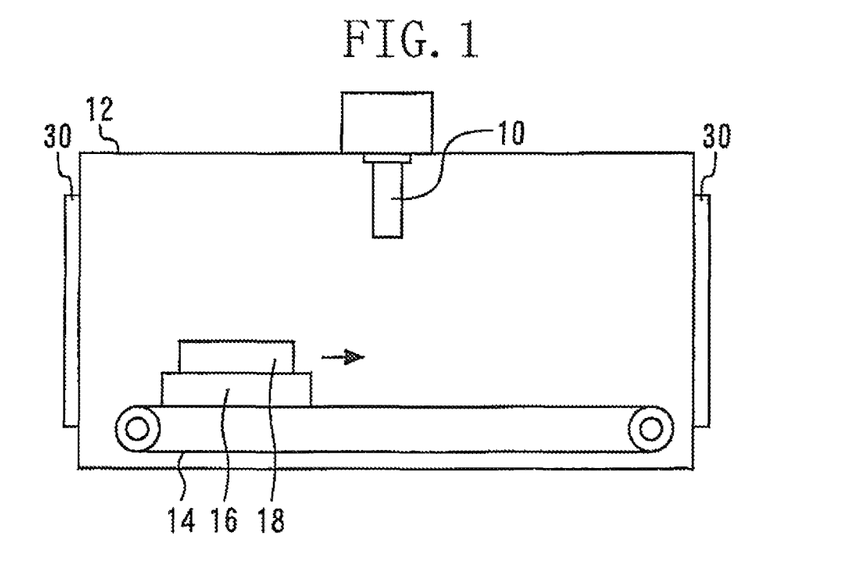
FIG. 1 is a diagram schematically showing a semiconductor manufacturing apparatus according to Embodiment 1 of the present invention.

FIG. 1 is a diagram schematically showing a semiconductor manufacturing apparatus according to Embodiment 1 of the present invention. The semiconductor manufacturing apparatus is provided with an application device 10. The application device 10 applies electrons or ions (electrons or ions hereinafter referred to as "application substance") to a processing object in an application chamber 12. A conveyor 14 is housed in the application chamber 12. A tray 18 is placed on the conveyor 14, with a tray base 16 interposed therebetween. The tray 18 is used to load the processing objects thereon. Openable and closable hatches 30 are mounted on the application chamber 12 to enable processing objects to be took in or out.

Figure 2:
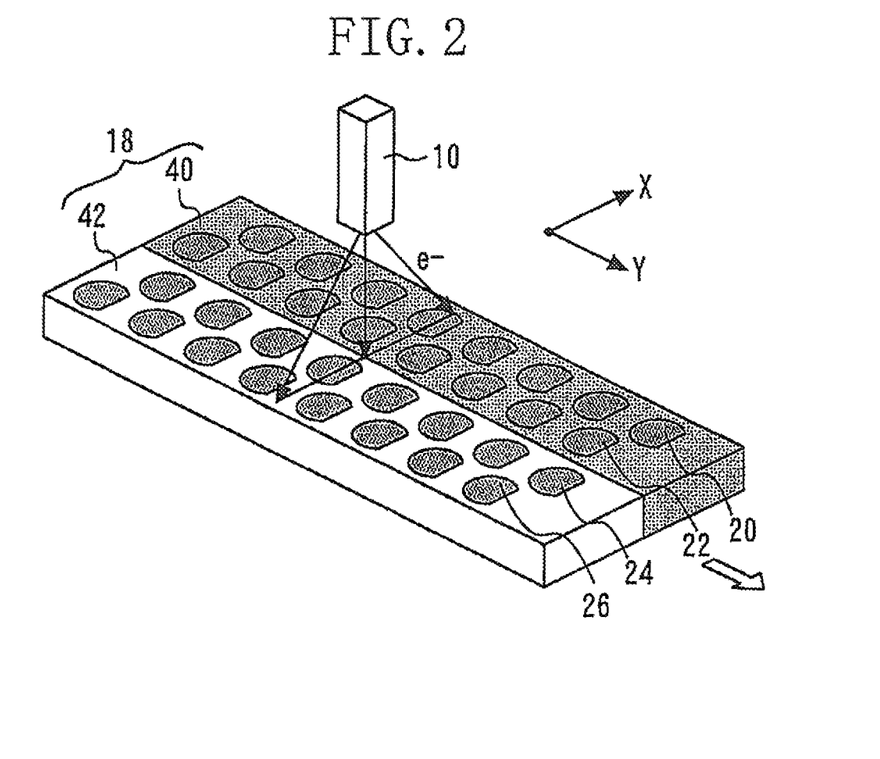
FIG. 2 is a perspective view showing the positions of the tray and the application device relative to each other.

FIG. 2 is a perspective view showing the positions of the tray and the application device relative to each other. The tray 18 includes a first tray 40 and a second tray 42 each formed in an elongated shape. Longer sides of the first tray 40 and the second tray 42 are in contact with each other. The position at which the first tray 40 and the second tray 42 contact each other will be referred to as a contact position. The first tray 40 and the second tray 42 are formed so as to be identical in shape to each other and can easily be interchanged in position.

The application device 10 is formed right above the contact position. The application device 10 is formed so as to swing along a first direction (x-direction) across the contact position while emitting the application substance. More specifically, the application device 10 can swing through an angle θ along a first direction and along the direction opposite to the first direction.

A plurality of processing objects is arranged on the tray 18. The plurality of processing objects is arranged in four rows along a second direction (y-direction) perpendicular to the first direction (x-direction). More specifically, the plurality of processing objects is arranged on the first tray 40 so as to form two rows parallel to the second direction and arranged on the second tray 42 so as to form two rows parallel to the second direction.

The processing objects arranged in four rows are constituted by a first group 20, a second group 22, a third group 24 and a fourth group 26 divided on a row-by-row basis. The two rows of processing objects, the first group 20 and the second group 22, are arranged on the first tray 40. The two rows of processing objects, the third group 24 and the fourth group 26, are arranged on the first tray 40. Each processing object is a wafer formed of an Si (silicon), or a compound semiconductor. The plurality of processing objects is moved along the second direction (y-direction) by feeding the first tray 40 and the second tray 42 along the second direction with the above-described conveyor 14.

Figure 3:
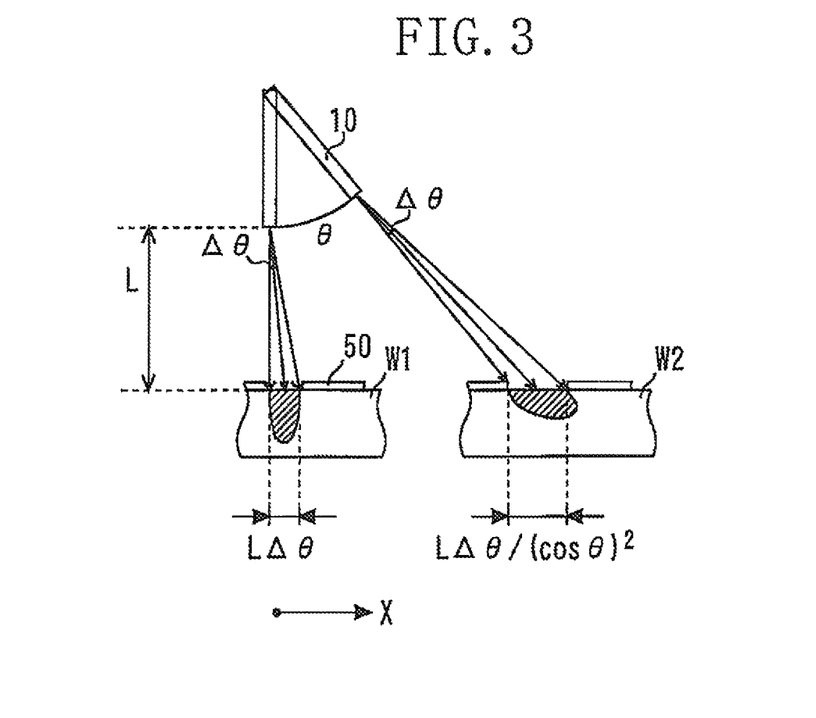
FIG. 3 is a sectional view showing differences in an application effect with respect to the positions of processing objects.

FIG. 3 is a sectional view showing differences in an application effect with respect to the positions of processing objects. FIG. 3 shows differences in the application effect when the application substance is applied to a wafer W1 in the vicinity of the position right below the application device 10 and a wafer W2 not close to the position right below the application device 10. The application effect is the effect of changing a characteristic of the processing object with application of the application substance. The application effect is changed, for example, by the depth reached by the application substance, the distribution of the application substance and the concentration of the application substance.

A resist 50 is formed by patterning on the wafers W1 and W2 to make differences in the application effect easier to recognize. If the distance between the application device 10 and the processing objects (W1, W2) is L and if the angle of application when the application device 10 applies the application substance to the wafer W1 is Δθ, the application length is LΔθ. On the other hand, when the application substance is applied to the wafer W2 by swinging the application device 10 through the angle θ, the application length is $L\Delta\theta/(\cos\theta)^2$.

Accordingly, the application length is increased when the angle θ is increased. Therefore, the amount of the application substance incident per unit area is reduced when the angle θ is increased. Also, the energy for acceleration of the application substance incident on the processing object is reduced when the angle θ is increased since the distance between the application device 10 and the processing object is increased when the angle θ is increased. In this situation, the amount of application per unit area can be constantly maintained by making the swing speed inversely proportional to $1/(\cos\theta)^2$ not depending on the fluctuation of the angle θ. In this situation, however, oblique application of the application substance to a smaller depth below the surface of the processing object cannot be avoided when the angle θ is increased.

Figure 4:
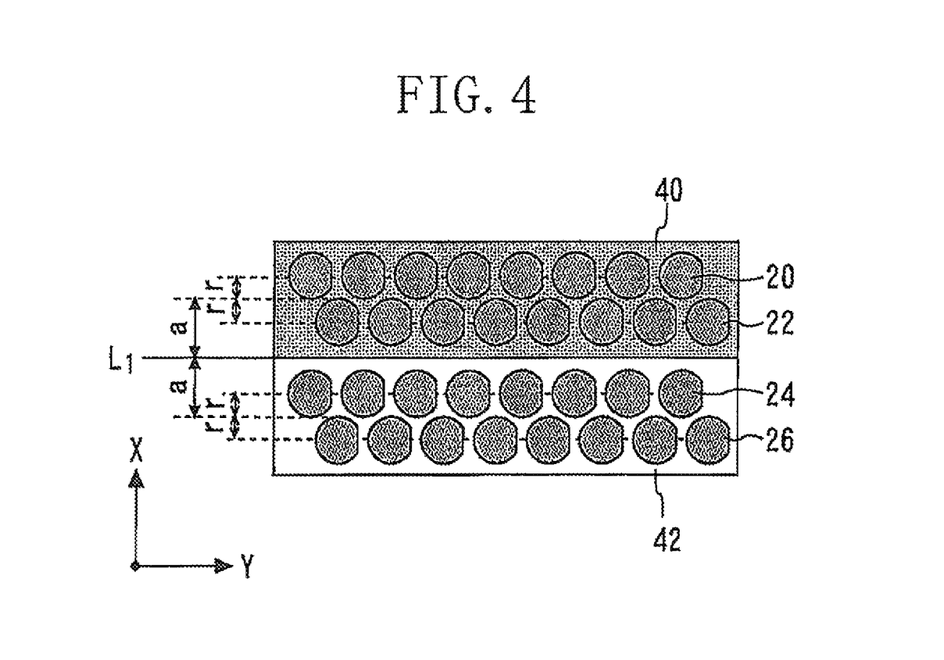
FIG. 4 is a plan view showing a state where a plurality of objects is arranged on the tray.

A semiconductor device manufacturing method according to Embodiment 1 of the present invention will be described. First, a plurality of processing objects is arranged on the tray. FIG. 4 is a plan view showing a state where a plurality of objects is arranged on the tray. A straight line L1 is a line drawn along the contact position. A distance a is the distance from the contact position to a position between the first group 20 and the second group 22 (or between the third group 24 and the fourth group 26). A distance r is the radius of the processing object.

The first group 20 is arranged in a position at a distance of a+r from L1 in the first direction. The second group 22 is arranged in a position at a distance of a−r from L1 in the first direction. The third group 24 is arranged in a position at a distance of −a+r from L1 in the direction opposite to the first direction. The fourth group 26 is arranged in a position at a distance of −a−r from L1 in the direction opposite to the first direction. The plurality of processing objects are arranged on the first tray 40 and the second tray 42.

Figure 5:
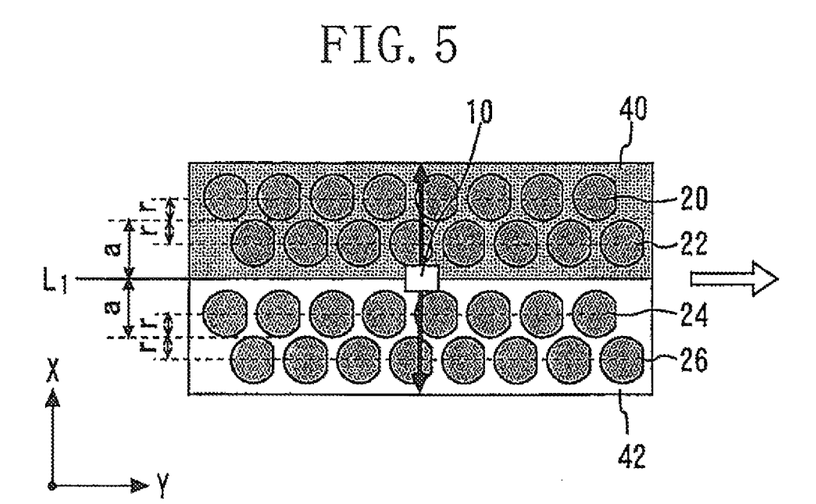
FIG. 5 is a plan view showing application of the application substance to the processing objects.

Next, an application step is executed. FIG. 5 is a plan view showing application of the application substance to the processing objects. In the application step, the application substance is emitted from the application device 10 formed right above the contact position while the application device 10 is being swung along the first direction across the contact position. Also, the first tray 40 and the second tray 42 are moved along the second direction. The movement of the first tray 40 and the second tray 42 is performed continuously or intermittently. The application substance is thus applied to the plurality of processing objects.

Figure 6:
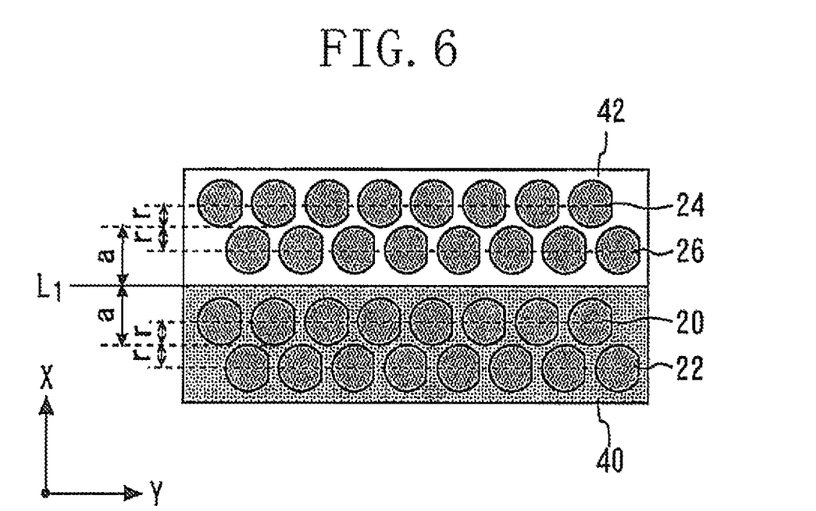
FIG. 6 is a plan view of the processing objects after the interchange step is executed.

The above-described application step is executed a certain number of times. An interchange step is thereafter executed. FIG. 6 is a plan view of the processing objects after the interchange step is executed. In the interchange step, the first tray 40 and the second tray 42 are interchanged in position without changing the directions of the first tray 40 and the second tray 42 corresponding to the second direction.

Figure 7:
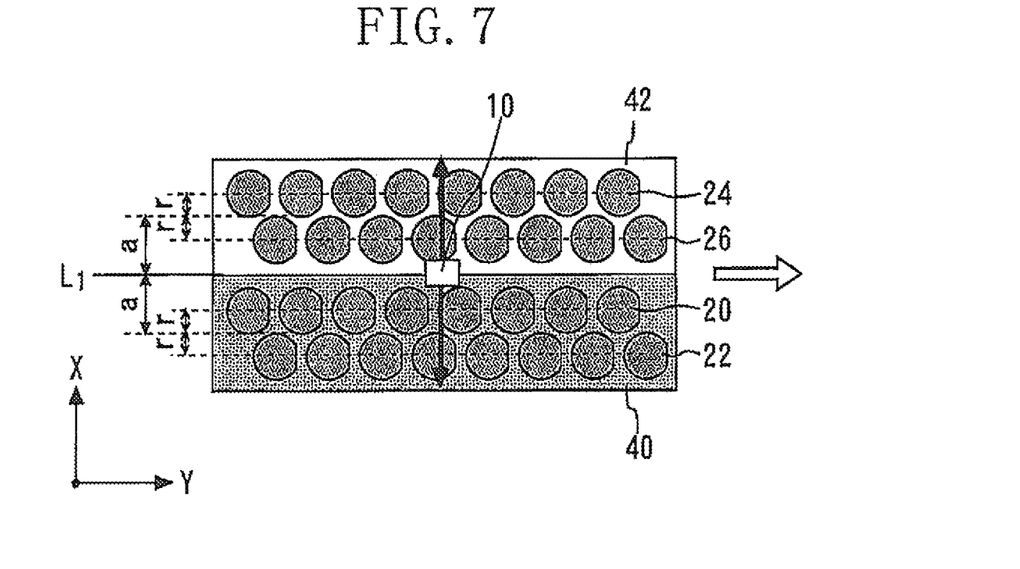
FIG. 7 is a plan view showing application of the application substance to the processing object after execution of the interchange step.

Next, the application step is again executed. FIG. 7 is a plan view showing application of the application substance to the processing object after execution of the interchange step. Preferably, the number of times the application step is executed before the interchange step and the number of times the application step is executed after the interchange step are set equal to each other.

It is assumed here that executing the application step 100 times is required to provide the desired amount of application for the processing objects. In a case where the application step is executed 100 times while the positions of the processing objects on the tray are fixed, the application effect changes depending on the extent to which each processing object deviates in the first direction. More specifically, the application effect varies between the groups to which the processing objects belong.

In the semiconductor device manufacturing method according to Embodiment 1 of the present invention, the interchange step is executed among a plurality of application steps. For example, after the application step is executed 50 times, the interchange step is executed and the application step is again executed another 50 times. With the execution of the interchange step, the processing objects are moved beyond the contact position. For example, the processing objects in the first group 20 undergo application of the application substance along the first direction in the application step before the interchange step and undergo application of the application substance along the direction opposite to the first direction in the application step after the interchange step. Any of the processing objects therefore undergoes application of the application substance along the first direction and application of the application substance along the direction opposite to the first direction, thus enabling reduction of variations in the amount of application along the first direction and, hence, reduction of variations in the application effect.

Further, in Embodiment 1 of the present invention, the application step is executed in such a state that an orientation flat of each processing object faces in the second direction every time the application step is executed. An application substance distribution substantially bilaterally symmetrical about a direction perpendicular to the orientation flat can therefore be obtained. A certain degree of uniformity of the influence of the application substance on characteristics of chips can be secured thereby. In many cases with power devices in particular, a pattern generally bilaterally symmetrical about a direction perpendicular to an orientation flat is formed. In such cases, therefore, the effect of reducing variations in the application effect can be improved if the application step is executed in such a state that the orientation flat of each processing object faces in the second direction every time the application step is executed.

If the contact position is the coordinate origin (x=0) in the first direction, the effect of application to the processing objects can be expressed by a function f(x) of x. If the number of application times (the number of times the application step is performed) is N, the application effect with respect to the groups are as shown below.

The application effect in the case where the interchange step is not performed is:
First group 20: $N \cdot f(a+r)$,
Second group 22: $N \cdot f(a-r)$,
Third group 24: $N \cdot f(-a+r)$, and
Fourth group 26: $N \cdot f(-a-r)$.

On the other hand, the application effect in the case where the interchange step is performed is:
First group 20: $N/2 \cdot \{f(a+r)+f(-a+r)\}$,
Second group 22: $N/2 \cdot \{f(a-r)+f(-a-r)\}$,
Third group 24: $N/2 \cdot \{f(-a+r)+f(a+r)\}$, and
Fourth group 26: $N/2 \cdot \{f(-a-r)+f(a-r)\}$. The distances a and r are the same as defined above with reference to FIG. 4.

In the case where the interchange step is executed, the application effects on the first group 20 and the third group 24 are equal to each other and the application effects on the second group 22 and the fourth group 26 are equal to each other. That is, the difference in application effect between the trays can be eliminated if the interchange step is executed. Also, since a generally bilaterally symmetrical distribution of the application substance is obtained, the resulting variations in the application effect can be considerably reduced.

If $f(x) \neq f(-x)$ is supposed in the case where the interchange step is not performed, four levels of application effect occur on the plurality of processing objects. In the case where the interchange step is performed if $f(x) \neq f(-x)$ is supposed, the number of levels of application effect can be reduced to two. If $f(x)=f(-x)$ is supposed in the case where the interchange step is not performed, two levels of application effect occur on the plurality of processing objects. In the case where the interchange step is performed if $f(x)=f(-x)$ is supposed, the number of levels of application effect can be reduced to one.

While the processing objects are wafers in Embodiment 1 of the present invention, the processing objects may alternatively be chips after dicing. Also, the application step may be executed by arranging a plurality of processing objects on a well-known wafer disk and rotating the wafer disk, for example. While two rows of processing objects are arranged on each of the first tray 40 and the second tray 42, only one row of processing objects or three or more rows of processing objects may alternatively be arranged on each tray. These modifications can also be applied to semiconductor device manufacturing methods and semiconductor manufacturing apparatuses according to embodiments described below.

Embodiment 2

A semiconductor device manufacturing method and a semiconductor manufacturing apparatus according to Embodiment 2 of the present invention correspond in many respects to those according to Embodiment 1 and will therefore be described mainly with respect to points of difference from Embodiment 1. The semiconductor device manufacturing method according to Embodiment 2 of the present invention is characterized by executing a reversal step of reversing the tray among a plurality of application steps.

Figure 8:
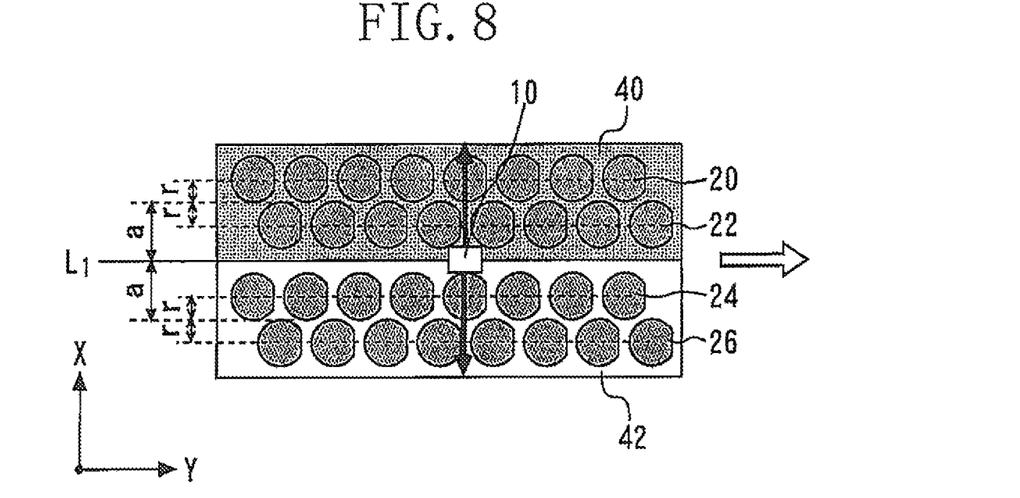
FIG. 8 is a plan view showing application of an application substance to processing objects in the first application process according to Embodiment 2 of the present invention.
Figure 9:
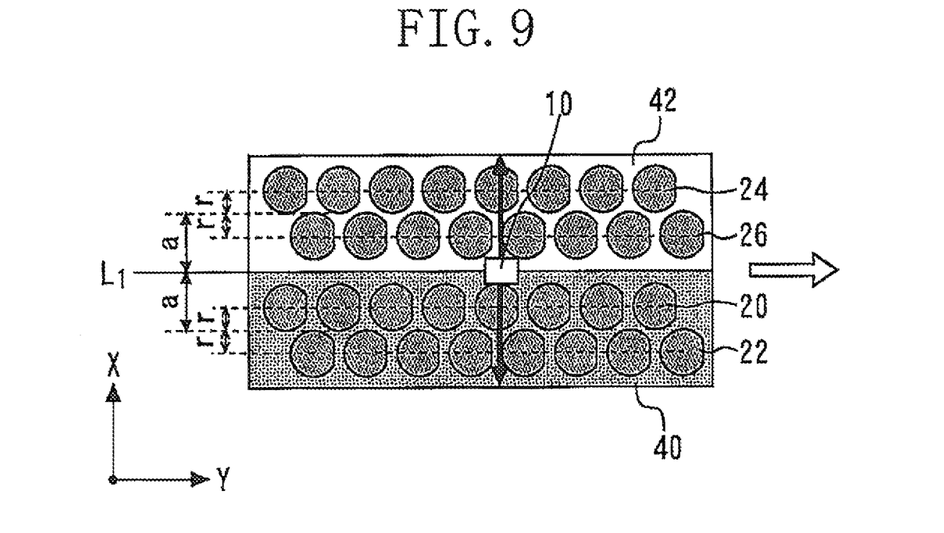
FIG. 9 is a plan view showing application of the application substance to the processing objects in the second application process.

First, an application step is executed 25 times. This process of executing the application step 25 times will be referred to as a first application process. FIG. 8 is a plan view showing application of an application substance to processing objects in the first application process according to Embodiment 2 of the present invention. Next, an interchange step is executed. Subsequently, the application step is executed 25 times. This process of executing the application step 25 times will be referred to as a second application process. FIG. 9 is a plan view showing application of the application substance to the processing objects in the second application process.

Figure 10:
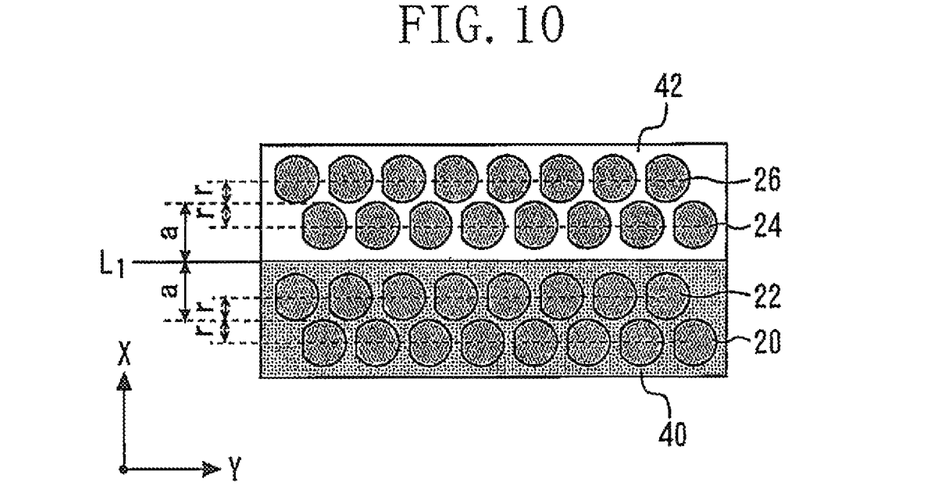
FIG. 10 is a plan view indicating the positions of the trays after execution of the reversal step.
Figure 11:
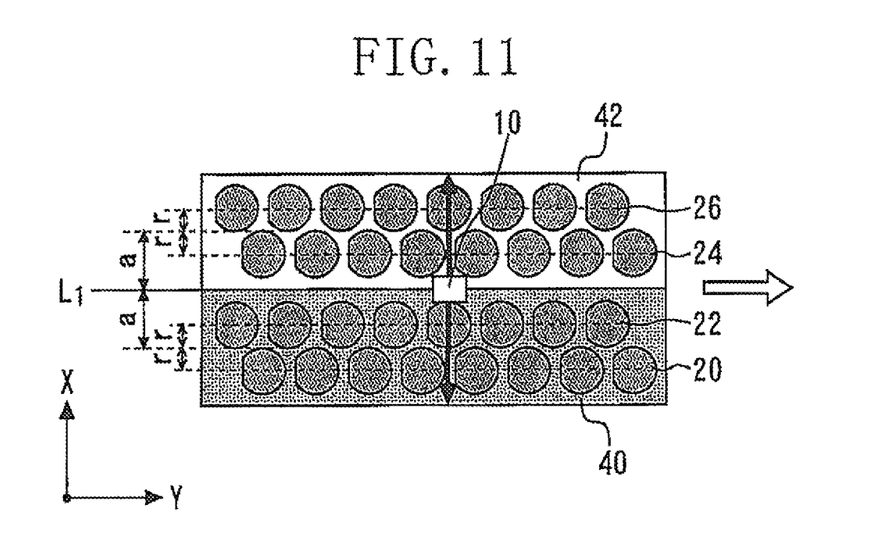
FIG. 11 is a plan view showing application of the application substance to the processing objects in the third application process.

Next, a reversal step is executed. In the reversal step, the first tray 40 and the second tray 42 are reversed so as to face in the direction opposite to the second direction. FIG. 10 is a plan view indicating the positions of the trays after execution of the reversal step. Subsequently, the application steps are executed 25 times. This process of executing the application step 25 times will be referred to as a third application process. FIG. 11 is a plan view showing application of the application substance to the processing objects in the third application process.

Figure 12:
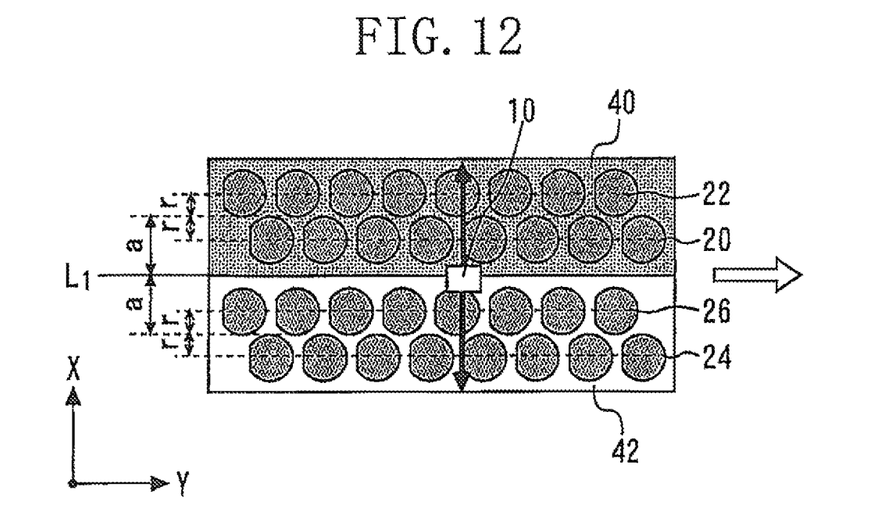
FIG. 12 is a plan view showing application of the application substance to the processing objects in the fourth application process.

Next, the interchange step is executed. In this interchange step, the first tray 40 and the second tray 42 are interchanged in position. Subsequently, the application steps are executed 25 times. This process of executing the application step 25 times will be referred to as a fourth application process. FIG. 12 is a plan view showing application of the application substance to the processing objects in the fourth application process. Thus, the application step is executed 100 times in total.

If the application effect at x before the reversal step is f(x), and if the application effect at x after the reversal step is f'(x), each of the application effects on the first group 20 and the third group 24 is N/4·{f(a+r)+f(−a+r)+f(−a−r)+f(a−r)}. Each of the application effects on the second group 22 and the fourth group 26 is N/4·{f(a−r)+f(−a−r)+f(−a+r)+f(a+r)}.

The application effect when the x-coordinate is a+r or −a−r has a large influence on variation in the application effect. There is, therefore, a possibility of the difference in application effect between the processing object processed only at the x-coordinate a+r position and not processed at the x-coordinate −a−r position and the processing object processed only at the x-coordinate −a−r position and not processed at the x-coordinate a+r position being increased. In Embodiment 2 of the present invention, therefore, the reversal step is provided to enable each processing object to be processed both at the x-coordinate a+r position and at the x-coordinate −a−r position, thus enabling reduction of variations in the application effect.

If the number of trays is M; the number of times the application step is executed is N; and N is a multiple of 2M, the application effect on the processing objects processed by the semiconductor device manufacturing method according to Embodiment 2 of the present invention is as shown below.

[Expression 1]

$$N/2M\left\{\sum_{k=-M/2}^{-1}\{f(ka+r)+f(ka-r)\}+\sum_{k=1}^{M/2}\{f(ka+r)+f(ka-r)\}\right\}\ldots$$

($M$: an even number)

$$N/2M\sum_{k=-(M-1)/2}^{(M-1)/2}\{f(ka+r)+f(ka-r)\}\ldots(M:\text{ an odd number})$$

While the first tray 40 and the second tray 42 are reversed in the reversal step in the semiconductor device manufacturing method according to Embodiment 2 of the present invention, reversing at least one of the first tray 40 and the second tray 42 as a step among the plurality of application steps so that the first or second tray faces in the direction opposite to the second direction is also possible. Timing of execution of the interchange step and the reversal step among the plurality of application steps may be determined as desired from the viewpoint of simplifying the process.

Embodiment 3

A semiconductor device manufacturing method and a semiconductor manufacturing apparatus according to Embodiment 3 of the present invention correspond in many respects to those according to Embodiment 1 and will therefore be described mainly with respect to points of difference from Embodiment 1. The semiconductor device manufacturing method according to Embodiment 3 of the present invention is characterized by providing trays each for receiving one row of processing objects.

Figure 13:
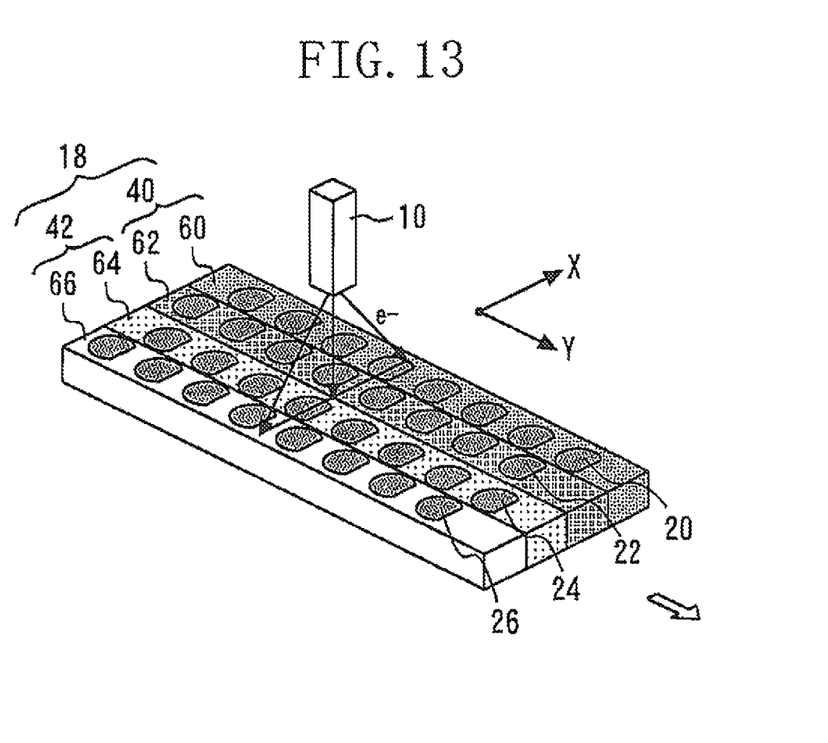
FIG. 13 is a perspective view of a portion including the trays according to Embodiment 3 of the present invention.

In the semiconductor manufacturing apparatus according to Embodiment 3 of the present invention, each of the first tray and the second tray is divided into two. FIG. 13 is a perspective view of a portion including the trays according to Embodiment 3 of the present invention. The first tray 40 includes first thin trays 60 and 62 each having one row of processing objects arranged thereon. The first thin tray 60 and the first thin tray 62 can be separated from each other. The second tray 42 includes second thin trays 64 and 66 each having one row of processing objects arranged thereon. The second thin tray 64 and the second thin tray 66 can be separated from each other.

In the semiconductor device manufacturing method according to Embodiment 3 of the present invention, an interchange step for interchanging the thin trays in position is executed a certain number of times among a plurality of application steps. Each of the plurality of processing objects is thereby subjected to the application step in each of the plurality of rows.

Figure 14:
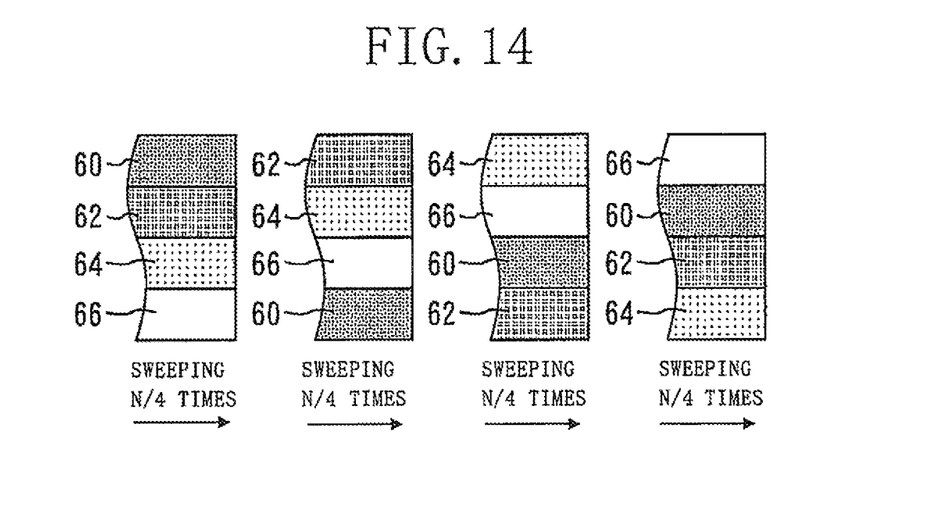
FIG. 14 is a plan view showing combinations of the first thin trays and the second thin trays.

FIG. 14 is a plan view showing combinations of the first thin trays and the second thin trays. The application step is executed 25 times with respect to each of the four combinations. The method of interchanging the trays in the interchange step is not limited to that shown in FIG. 14. However, rotation of the first thin trays 60 and 62 and the second thin trays 64 and 66 is preferred because interchanging can be simplified thereby.

In Embodiment 3 of the present invention, each of the plurality of processing objects is subjected to the application step in each of the four rows. Therefore, variations in the application effect on the plurality of processing objects can be eliminated. If the number of thin trays is M; the number of times the application step is executed is N; and N is a multiple of M, the application effect on the processing objects processed by the semiconductor device manufacturing method according to Embodiment 3 of the present invention is as shown below.

[Expression 2]

$$N/M \left\{ \sum_{k=-M/2}^{-1} f(ka+r) + \sum_{k=1}^{M/2} f(ka+r) \right\} \quad ...(M: \text{an even number})$$

$$N/M \left\{ \sum_{k=-(M-1)/2}^{(M-1)/2} f(ka+r) \right\} \quad ... (M: \text{an odd number})$$

For example, in a case where three rows of processing objects are arranged on the first tray 40, three first thin trays are prepared. The provision of one first thin tray (or second thin tray) for each row of processing objects in this way enables obtaining the effect of the semiconductor device manufacturing method according to Embodiment 3 of the present invention. Accordingly, the number of first thin trays and the number of second thin trays are not limited to two.

Embodiment 4

In a semiconductor device manufacturing method and a semiconductor manufacturing apparatus according to Embodiment 4 of the present invention, variations in the application effects on processing objects are reduced while one tray not divided is used.

Figure 15:
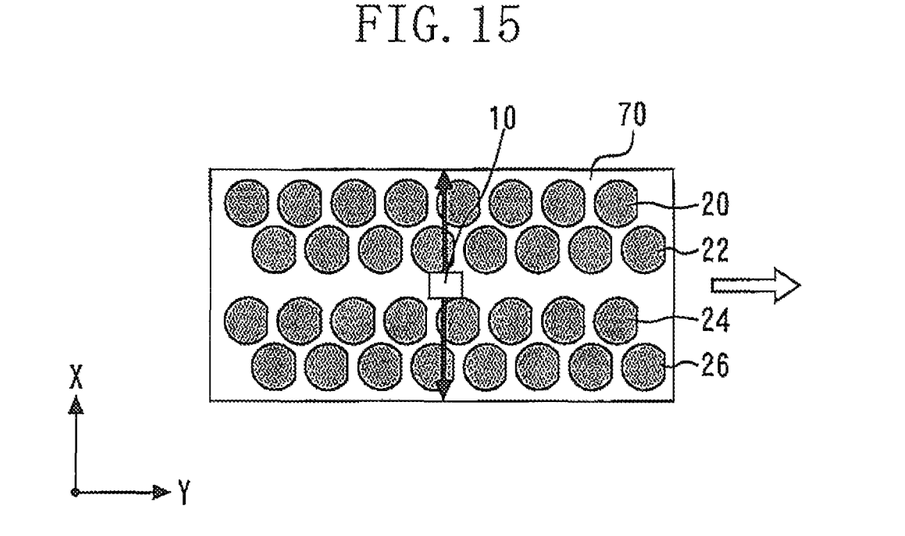
FIG. 15 is a plan view showing application of an application substance to the plurality of processing objects performed by executing the application step in the semiconductor device manufacturing method according to Embodiment 4 of the present invention.

In the semiconductor device manufacturing method according to Embodiment 1 of the present invention, a plurality of processing objects are first placed on the tray. The plurality of processing objects is arranged in four rows, as are those in the above-described embodiments. Next, an application step is executed 50 times. FIG. 15 is a plan view showing application of an application substance to the plurality of processing objects performed by executing the application step in the semiconductor device manufacturing method according to Embodiment 4 of the present invention. The movements of the application device 10 and a tray 70 are the same as those of the corresponding device and tray in the above-described embodiments.

Figure 16:
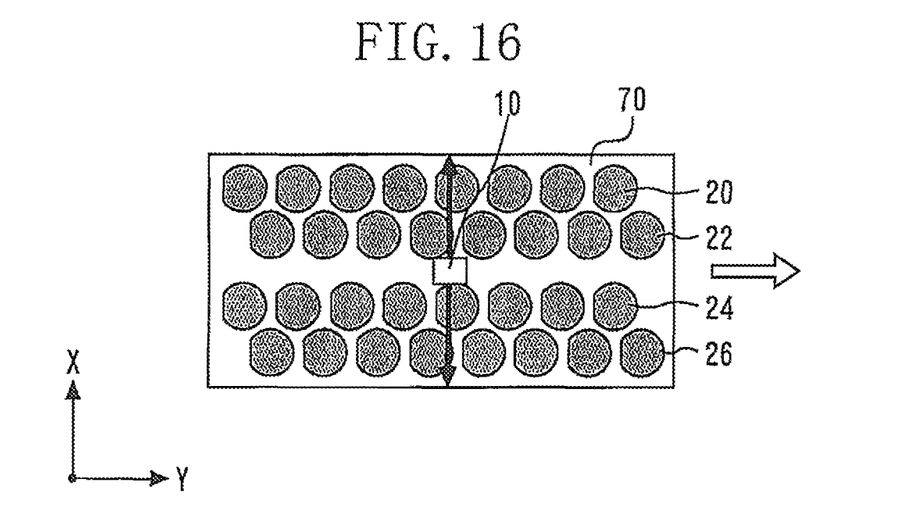
FIG. 16 is a plan view showing application of the application substance to the plurality of processing objects performed by executing the application step after execution of the processing object reversal step.

Next, a processing object reversal step is executed. In the processing object reversal step, each of the plurality of processing objects is reversed so as to face in the direction opposite to the first direction. That is, each processing object is reversed from a state where its orientation flat faces in the first direction to a state where its orientation flat faces in the direction opposite to the first direction. For example, a wafer moving arm is used to reverse the processing objects. After reversing, each processing object is returned to the original position on the tray 70. Subsequently, the application step is executed 50 times. FIG. 16 is a plan view showing application of the application substance to the plurality of processing objects performed by executing the application step after execution of the processing object reversal step.

In the semiconductor device manufacturing method according to Embodiment 4 of the present invention, a bilaterally symmetrical application effect can be obtained with respect to a pattern formed so as to be bilaterally symmetrical about a direction perpendicular to the orientation flat. More specifically, the application effects at two points at equal distances from the center of the orientation flat of the wafer in the leftward and rightward directions can be made equal to each other.

In some cases, reversing each wafer (processing object) may ensure a higher processing efficiency in comparison with reversing the tray, depending on the processing object handling system of the apparatus. If the processing objects are chips smaller than wafers, the change in position in the x-direction when the chips are turned is negligible and, therefore, the uniformizing effect on the bilateral asymmetry of each chip is high. The processing object reversal step can be executed in combination with Embodiment 1 or 3.

According to the present invention, as described above with respect to the Embodiments 1 to 4, the interchange step to interchange the first tray 40 and the second tray 42 in position without changing the directions of the first tray 40 and the second tray 42 corresponding to the second direction or the processing object turning step is executed at least one time among the plurality of application steps, thereby reducing variations in the application effect. Various modifications can therefore be made as long as this feature is not lost.

DESCRIPTION OF SYMBOLS

10 application device, 12 application chamber, 14 conveyor, 16 tray base, 18 tray, 20 first group, 22 second group, 24 third group, 26 fourth group, 40 first tray, 42 second tray, 50 resist, 60,62 first thin tray, 64,66 second thin tray, 70 tray

The invention claimed is:
1. A semiconductor device manufacturing method comprising:
   a step of arranging a plurality of processing objects on a first tray and a second tray adjacent to the first tray;
   a plurality of application steps in which application of an application substance to the plurality of processing objects is repeated a certain number of times by emitting the application substance from an application device formed right above a contact position at which the first tray and the second tray contact each other, by swinging the application device along a first direction across the contact position, and by moving the first tray and the second tray in a second direction perpendicular to the first direction; and
   an interchange step of interchanging the first tray and the second tray in position without changing the directions of the first tray and the second tray corresponding to the second direction, the interchange step being executed at least one time among the plurality of application steps.
2. The semiconductor device manufacturing method according to claim 1, wherein the plurality of processing objects are arranged on the first tray so as to form a plurality of rows parallel to the second direction and arranged on the second tray so as to form a plurality of rows parallel to the second direction, the method further comprising a reversal step of reversing at least one of the first tray and the second tray so that the first or second tray faces in a direction opposite to the second direction among the plurality of application steps.
3. The semiconductor device manufacturing method according to claim 1,
   wherein the plurality of processing objects are arranged on the first tray so as to form a plurality of rows parallel to the second direction and arranged on the second tray so as to form a plurality of rows parallel to the second direction, wherein the first tray is constructed so as to be capable of being divided into a plurality of first thin trays each having one row of processing objects arranged thereon, wherein the second tray is constructed so as to be capable of being divided into a plurality of second thin trays each having one row of processing objects arranged thereon, and wherein the interchange process is executed a certain number of times among the plurality of application steps, and each of the plurality of processing objects is subjected to the application step in each of the plurality of rows.

4. A semiconductor device manufacturing method comprising:

a step of placing a plurality of processing objects on a tray;

a plurality of application steps in which application of an application substance to the plurality of processing objects is repeated a certain number of times by emitting the application substance from an application device formed right above the tray, by swinging the application device along a first direction, and by moving the tray in a second direction perpendicular to the first direction; and a processing object reversal step of reversing each of the plurality of processing objects among the plurality of application steps so that the processing object faces in a direction opposite to the second direction.

5. A semiconductor manufacturing apparatus comprising:

a first tray;

a second tray adjacent to the first tray;

an application device formed right above a contact position at which the first tray and the second tray contact each other, the application device being swung along a first direction across the contact position while emitting an application substance; and a conveyor that feeds the first tray and the second tray in a second direction perpendicular to the first direction.

* * * * *